(12) United States Patent
Yang et al.

(10) Patent No.: US 8,902,674 B2
(45) Date of Patent: Dec. 2, 2014

(54) SEMICONDUCTOR MEMORY DEVICE AND METHOD OF READING OUT THE SAME

(75) Inventors: In Gon Yang, Icheon-si (KR); Duck Ju Kim, Icheon-si (KR); Jae Won Cha, Icheon-si (KR); Sung Hoon Ahn, Seoul (KR); Tae Ho Jeon, Goyang-si (KR)

(73) Assignee: SK Hynix Inc., Gyeonggi-do (KR)

( * ) Notice: Subject to any disclaimer, the term of this patent is extended or adjusted under 35 U.S.C. 154(b) by 213 days.

(21) Appl. No.: 13/451,110

(22) Filed: Apr. 19, 2012

(65) Prior Publication Data

US 2012/0269007 A1    Oct. 25, 2012

(30) Foreign Application Priority Data

Apr. 25, 2011    (KR) .......................... 10-2011-0038305

(51) Int. Cl.
*G11C 7/00* (2006.01)
*G11C 7/10* (2006.01)

(52) U.S. Cl.
CPC ... *G11C 7/00* (2013.01); *G11C 7/10* (2013.01)
USPC ........... 365/189.05; 365/189.011; 365/185.09

(58) Field of Classification Search
None
See application file for complete search history.

(56) References Cited

U.S. PATENT DOCUMENTS

2008/0056005 A1*   3/2008   Aritome .................... 365/185.21
2009/0238005 A1*   9/2009   You .......................... 365/185.18

FOREIGN PATENT DOCUMENTS

KR          1020110004100 A          1/2011

* cited by examiner

*Primary Examiner* — James G Norman
(74) *Attorney, Agent, or Firm* — William Park & Associates Ltd.

(57) ABSTRACT

A semiconductor memory device includes a memory cell array configured to include memory cells, peripheral circuits configured to read out data stored in a selected memory cell in a read operation, and a controller configured to control the peripheral circuits so that the peripheral circuits sense a voltage level of the bit line when a first read voltage of the read voltages is supplied to the word line and the peripheral circuits sense voltage levels of the bit line when a second read voltage lower than the first read voltage by a specific level and a third read voltage higher than the first read voltage by the specific level are supplied to the word line in order to determine whether a threshold voltage of the selected memory cell falls within a set voltage distribution in the read operation.

15 Claims, 5 Drawing Sheets

SEMICONDUCTOR MEMORY DEVICE AND METHOD OF READING OUT THE SAME

CROSS-REFERENCE TO RELATED APPLICATION

Priority is claimed to Korean patent application number 10-2011-0038305 filed on Apr. 25, 2011, the entire disclosure of which is incorporated herein by reference in its entirety.

BACKGROUND

Exemplary embodiments relate generally to a semiconductor memory device and a method of reading out the same, and more particularly to a semiconductor memory device of reading out normal read data and over-sampling read data in a read operation and a method of reading out the same.

Semiconductor memory devices can be divided into a volatile memory device and a non-volatile memory device. The volatile memory device requires power to retain the stored information. On the other hands, the non-volatile memory device can retain the stored information even in absence of power supply.

With increasing demand for highly integrated memory devices, semiconductor memory devices in which multi-bit data are stored in a single memory cell are generally used. For example, in the non-volatile memory device in which multi-bit data is stored, threshold voltage distributions of adjacent memory cells may partially overlap with each other due to the narrow interval between each distribution.

FIG. 1 shows threshold voltage distributions of a known semiconductor memory device.

In the semiconductor memory device of FIG. 1, threshold voltage distributions of memory cells overlapping with each other are shown. In a read operation, data may be erroneously read out from memory cells having threshold voltages included in the overlapped parts. An error included in the read data may be corrected by using a memory controller in a read operation.

BRIEF SUMMARY

Exemplary embodiments relate to a semiconductor memory device and a method of reading out the same, which are capable of reducing the read time by using a cache read method of reading out normal data from a memory cell using a normal read voltage and of reading out over-sampling data, indicating whether the threshold voltage of the memory cell falls within a specific voltage range, using a first read voltage lower than the normal read voltage and a second read voltage higher than the normal read voltage in a read operation.

A semiconductor memory device according to an embodiment of the present invention includes a memory cell array configured to include a plurality of memory cells coupled in series between a bit line and a common source line, peripheral circuits configured to read out data stored in a memory cell, selected from among the plurality of memory cells, by sequentially supplying a plurality of read voltages to a word line, coupled to the selected memory cell, in a read operation, and a controller configured to control the peripheral circuits so that the peripheral circuits sense a voltage level of the bit line when a first read voltage of the plurality of read voltages is supplied to the word line and the peripheral circuits sense voltage levels of the bit line when a second read voltage lower than the first read voltage by a specific level and a third read voltage higher than the first read voltage by the specific level are supplied to the word line in order to determine whether a threshold voltage of the selected memory cell falls within a set voltage distribution in the read operation.

A method of reading out a semiconductor memory device according to an embodiment of the present invention includes supplying a first read voltage to a word line coupled to a memory cell, storing first data in the cache latch unit of a page buffer by sensing a voltage of a bit line coupled to the memory cell, sequentially supplying a second read voltage lower than the first read voltage and a third read voltage higher than the first read voltage to the word line in order to determine whether a threshold voltage distribution of the memory cell falls within a set voltage distribution, storing second data in the main latch unit of the page buffer by sensing a voltage level of the bit line and outputting the first data of the cache latch unit to a data line, and transferring the second data of the main latch unit to the cache latch unit and then outputting the second data to the data line.

A method of reading out a semiconductor memory device according to an embodiment of the present invention includes storing first normal data in the main latch unit of a page buffer by supplying a first read voltage to a word line coupled to a memory cell and by sensing a voltage level of a bit line coupled to the memory cell, storing second normal data in the main latch unit in which the first normal data is stored so that the second normal data is overlapped with the first normal data, by supplying a second read voltage to the word line and by sensing a voltage level of the bit line, transferring the second normal data to the cache latch unit of the page buffer and storing the second normal data in the cache latch unit, storing over-sampling data in the main latch unit by sequentially supplying a third read voltage lower than the first read voltage, a fourth read voltage higher than the first read voltage, a fifth read voltage lower than the second read voltage, and a sixth read voltage higher than the second read voltage to the word line and by sensing voltage levels of the bit line, outputting the second normal data of the cache latch unit to a data line, and transferring the over-sampling data of the main latch unit to the cache latch unit and then outputting the over-sampling data to the data line.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
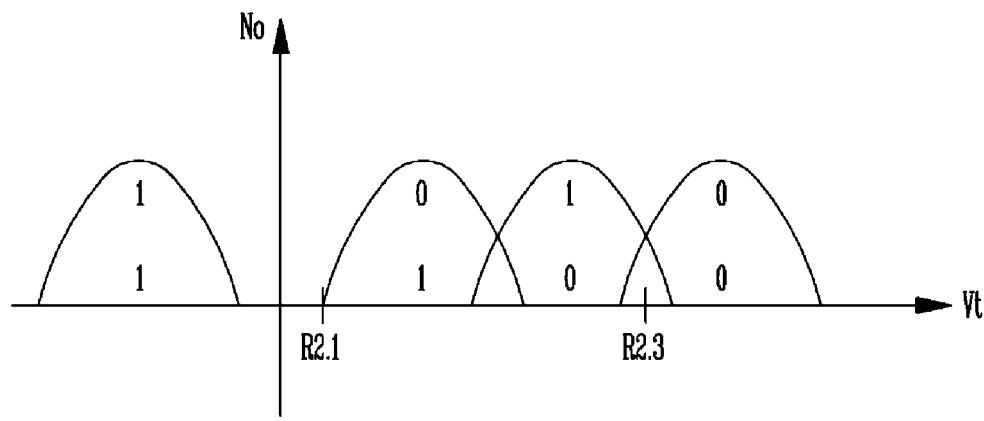
FIG. 1 shows threshold voltage distributions of a known semiconductor memory device.
Figure 2:
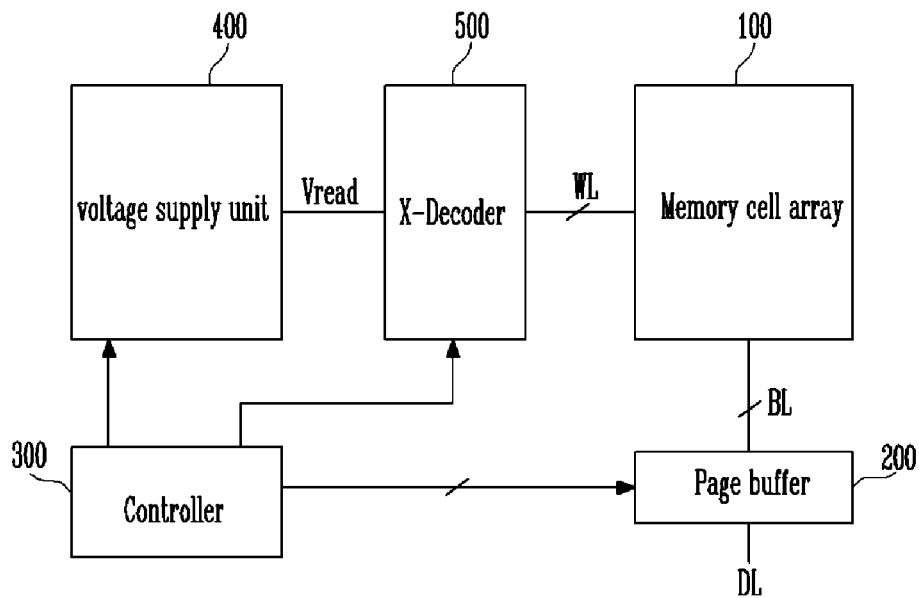
FIG. 2 shows the configuration of a semiconductor memory device according to an exemplary embodiment of the present invention.

FIG. 2 shows the configuration of a semiconductor memory device according to an exemplary embodiment of the present invention.

Referring to FIG. 2, the semiconductor memory device includes a memory cell array 100, a page buffer 200, a controller 300, a voltage supply unit 400, and an X decoder 500.

The memory cell array 100 includes a plurality of memory cell for storing data.

The page buffer 200 is coupled between a data line DL and the bit line BL of the memory cell array 100 and is configured to read out normal read data and over-sampling read data by sensing a voltage level of the bit line BL of the memory cell array 100 in response to a plurality of page buffer control signals from the controller 300 in a read operation.

The controller 300 generates a plurality of control signals for controlling the page buffer 200, the voltage supply unit 400, and the X decoder 500 in a read operation.

The voltage supply unit 400 generates a read voltage Vread in response to a read voltage control signal of the controller 300 in a read operation.

The X decoder 500 applies the read voltage Vread to a word line of the memory cell array 100 in response to a decoder control signal of the controller 300 in a read operation.

Figure 3:
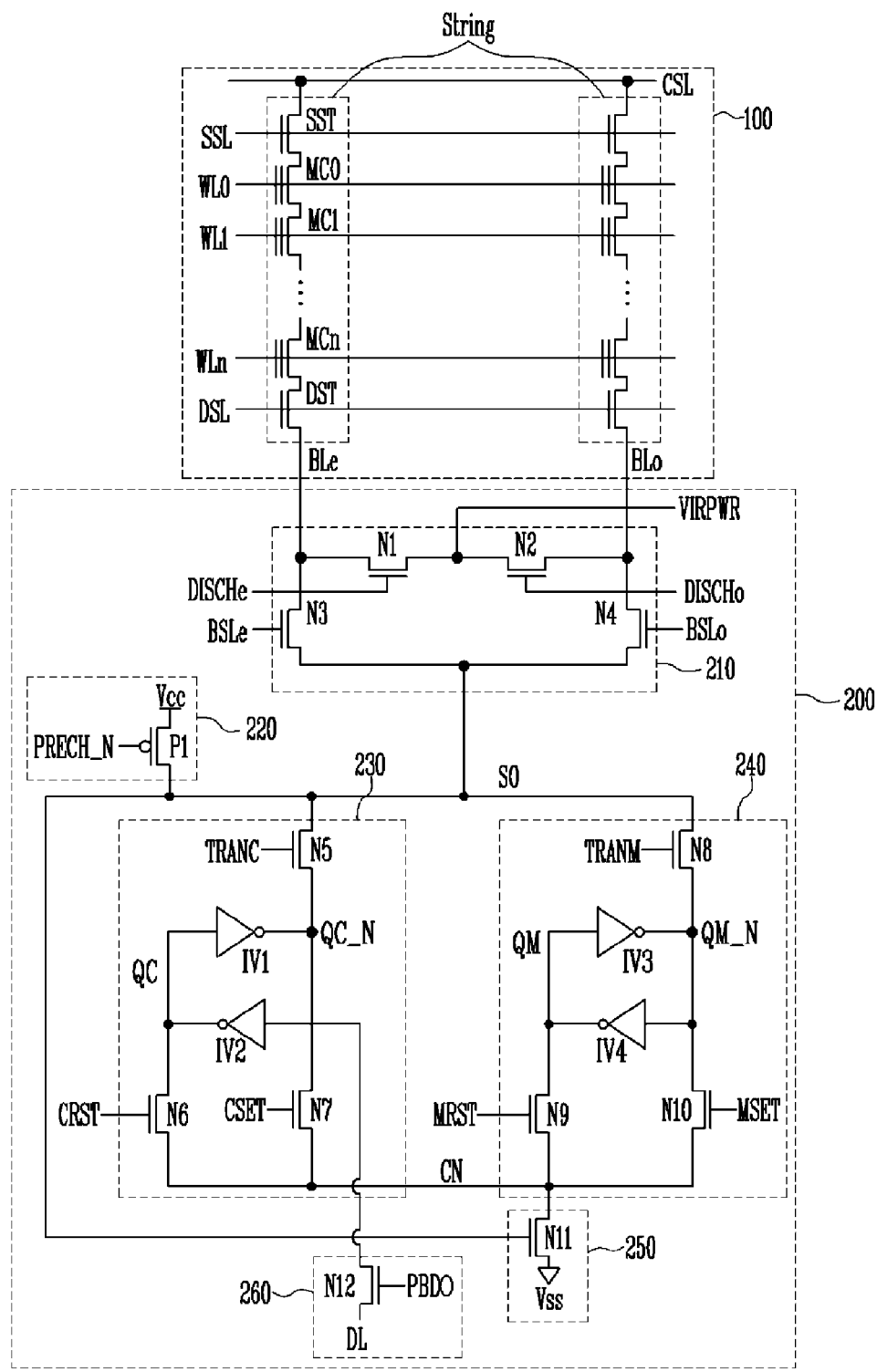
FIG. 3 is a detailed circuit diagram of a memory cell array and a page buffer shown in FIG. 2.

FIG. 3 is a detailed circuit diagram of the memory cell array 100 and the page buffer 200 shown in FIG. 2.

Referring to FIG. 3, the semiconductor memory device includes the memory cell array 100 and the page buffer 200.

The memory cell array 100 includes a plurality of cell strings String coupled between bit lines BLe and BLo and a common source line CSL. Each of the cell strings String includes a drain select transistor DST, a plurality of memory cells MC0, MC1, ..., MCn, and a source select transistor SST which are coupled in series between the bit line BLe and the common source line CSL. The gates of the memory cells MC0, MC1, ..., MCn are coupled to respective word lines WL0, WL1, ..., WLn. In a read operation, the read voltage Vread is supplied to the gates of the memory cells MC0, MC1, ..., MCn through the word lines WL0, WL1, ..., WLn.

The page buffer 200 is coupled between the data line DL and the bit lines BLe and BLo of the memory cell array 100.

The page buffer 200 includes a bit line select unit 210, a precharge unit 220, a cache latch unit 230, a main latch unit 240, a sense node sensing unit 250, and a data read unit 260.

The bit line select unit 210 selects the even bit line BLe or the odd bit line BLo and couples the selected bit line and a sense node SO in a read operation. The bit line select unit 210 includes a plurality of transistors N1 to N4. The transistor N1 is coupled between the even bit line BLe and a virtual voltage supply terminal for a virtual voltage VIRPWR and is configured to supply the virtual voltage VIRPWR to the even bit line BLe in response to an even discharge signal DISCHe. The transistor N2 is coupled between the odd bit line BLo and the virtual voltage supply terminal and is configured to supply the virtual voltage VIRPWR to the odd bit line BLo in response to an odd discharge signal DISCHo. The transistor N3 is coupled between the even bit line BLe and the sense node SO and is configured to couple the even bit line BLe and the sense node SO in response to an even bit line select signal BSLe. The transistor N4 is coupled between the odd bit line BLo and the sense node SO and is configured to couple the odd bit line BLo and the sense node SO in response to an odd bit line select signal BSLo.

The precharge unit 220 precharges the sense node SO so that the sense node SO is at a high level during some period of a read operation. The precharge unit 220 may comprise a PMOS transistor P1 coupled between a terminal for a power source voltage Vcc and the sense node SO. The PMOS transistor P1 precharges the sense node SO by supplying the power source voltage Vcc to the sense node SO in response to a precharge signal PRECH_N that is enabled at a low level.

In a read operation, the main latch unit 240 senses a voltage level of the sense node SO that varies depending on the threshold voltage of a memory cell coupled to a selected bit line (e.g., the even bit line BLe) and temporarily stores data corresponding to the sensed voltage.

The main latch unit 240 includes a latch for storing sensed data and a plurality of transistors N8, N9, and N10. The latch comprises inverters IV3 and IV4 which are coupled in parallel between a first node QM and a second node QM_N in opposite directions. The transistor N8 is coupled between the sense node SO and the second node QM_N. In a data transfer operation, the transistor N8 couples the sense node SO and the second node QM_N in response to a transfer signal TRANM so that the voltage level of the sense node SO is changed depending on data stored in the latch. The transistor N9 is coupled between a common node CN and the first node QM. In a main latch reset operation, the transistor N9 resets the common node CN, coupled to a ground voltage terminal Vss, and the first node QM in response to a main latch reset signal MRST. Furthermore, in a data sensing operation, the transistor N9 couples the first node QM and the common node CN that is coupled to or separated from the ground voltage terminal Vss depending on the voltage level of the sense node SO. The transistor N10 is coupled between the common node CN and the second node QM_N. In a data sensing operation, the transistor N10 couples the common node CN and the second node QM_N in response to a main latch set signal MSET.

The cache latch unit 230 temporarily stores data received from the main latch unit 240 in a data transfer operation and outputs the temporary data to the data line DL in a data output operation.

The cache latch unit 230 includes a latch for storing data received from the main latch unit 230 and a plurality of transistors N5, N6, and N7. The latch is formed of inverters IV1 and IV2 which are coupled in parallel between a third node QC and a fourth node QC_N in opposite directions. The transistor N5 is coupled between the sense node SO and the fourth node QC_N and is configured to couple the sense node SO and the fourth node QC_N in response to a transfer signal TRANC. The transistor N6 is coupled between the common node CN and the third node QC and is configured to couple the common node CN, coupled to the ground voltage terminal Vss, and the third node QC in response to a cache latch reset signal CRST in a cache latch reset operation. The transistor N7 is coupled between the common node CN and the fourth node QC_N and is configured to couple the common node CN and the fourth node QC_N in response to a cache latch set signal CSET in a data transfer operation.

The sense node sensing unit 250 includes a transistor N11 coupled between the common node CN and the ground voltage terminal Vss. The transistor N11 couples the common node CN and the ground voltage terminal Vss depending on the voltage level of the sense node SO.

The data read unit 260 includes a transistor N12 coupled between the data line DL and the fourth node QC_N of the cache latch unit 230. The transistor N12 couples the fourth node QC_N and the data line DL in response to a data read signal PBDO in a data read operation so that data stored in the cache latch unit 230 is outputted to the data line DL.

Figure 4:
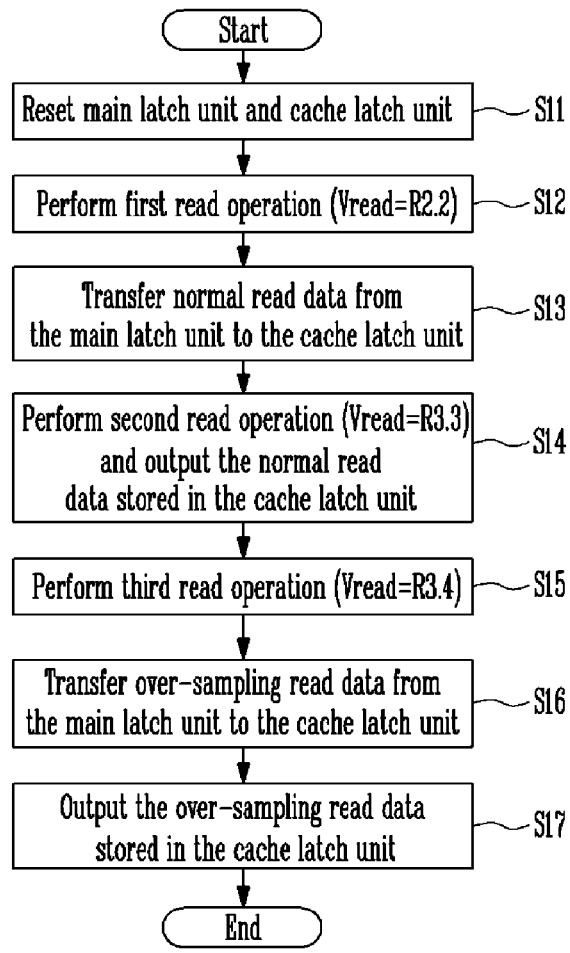
FIG. 4 is a flowchart illustrating a least significant bit (hereinafter referred to as an 'LSB') data read operation according to an exemplary embodiment of the present invention.
Figure 5:
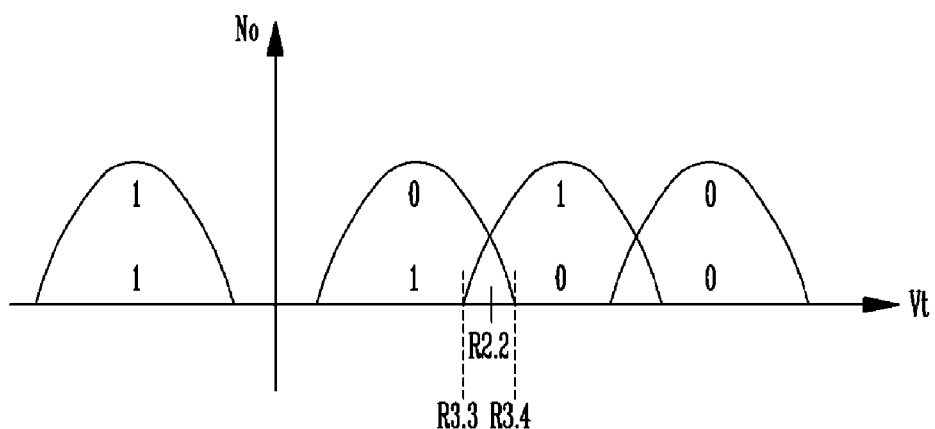
FIG. 5 shows threshold voltage distributions of the LSB data read operation according to an exemplary embodiment of the present invention.

FIG. 4 is a flowchart illustrating an LSB data read operation according to an exemplary embodiment of the present invention. FIG. 5 shows threshold voltage distributions of the LSB data read operation according to an exemplary embodiment of the present invention. The LSB data read operation according to an exemplary embodiment of the present invention is described below with reference to FIGS. 2 to 5.

1) Resetting the Main Latch Unit and the Cache Latch Unit (S11)

The precharge unit 220 precharges the sense node SO in response to the precharge signal PRECH_N of a low level so that the sense node SO maintains a high level during a certain period. The sense node sensing unit 250 couples the common node CN and the ground voltage terminal Vss when the sense node SO is at a high level.

The main latch unit 240 couples the common node CN and the first node QM in response to the main latch reset signal MRST so that the first node QM is reset to a low level.

The cache latch unit 230 couples the common node CN and the third node QC in response to the cache latch reset signal CRST so that the third node QC is reset to a low level.

2) Performing a First Read Operation (S12)

The precharge unit 220 of the page buffer 200 precharges the sense node SO in response to the precharge signal PRECH_N of a low level so that the sense node SO maintains a high level for a specific period of time.

The voltage supply unit 400 generates a first read voltage R2.2 and a pass voltage in response to the control signal of the controller 300. The X decoder 500 applies the first read voltage R2.2 to the word line WL0 coupled to a memory cell (e.g., MC0), selected from among the memory cells MC0, MC1, . . . , MCn of the memory cell array 100 and applies the pass voltage to the remaining memory cells MC1, MC2, . . . , MCn.

The bit line select unit 210 couples a bit line (e.g., the even bit line BLe), selected from among the even bit line BLe and the odd bit line BLo, and the sense node SO. As a result, the voltage of the sense node SO is maintained at a high level or discharged to a low level depending on the threshold voltage of the memory cell MC0.

The sense node sensing unit 250 connects or disconnects the common node CN and the ground voltage terminal Vss depending on the voltage level of the sense node SO. The main latch unit 240 couples the common node CN and the second node QM_N in response to the main latch set signal MSET.

Consequently, normal read data is stored in the latch of the main latch unit 240 by maintaining or inverting data value in the latch of the main latch unit 240 depending on the voltage level of the sense node SO determined based on the threshold voltage of the memory cell MC0. In an embodiment of the present invention, the normal read data is the data read by using the first read voltage R2.2 as a read voltage.

3) Transferring the Normal Read Data from the Main Latch Unit to the Cache Latch Unit (S13)

The precharge unit 220 precharges the sense node SO in response to the precharge signal PRECH_N of a low level so that the sense node SO maintains a high level for a specific period of time.

The second node QM_N and the sense node SO are coupled in response to the transfer signal TRANM applied to the main latch unit 240. As a result, the voltage of the sense node SO is maintained at a high level or discharged to a low level depending on the normal read data stored in the main latch unit 240.

The sense node sensing unit 250 connects or disconnects the common node CN and the ground voltage terminal Vss depending on the voltage level of the sense node SO. The cache latch unit 230 couples the common node CN and the fourth node QC_N in response to the cache latch set signal CSET.

Consequently, the normal read data is stored in the latch of the cache latch unit 230 by maintaining or inverting data value in the latch of the cache latch unit 230 depending on the voltage level of the sense node SO determined based on the normal read data stored in the main latch unit 240.

4) Performing a Second Read Operation and Output the Normal Read Data Stored in the Cache Latch Unit (S14)

The precharge unit 220 precharges the sense node SO in response to the precharge signal PRECH_N of a low level so that the sense node SO maintains a high level for a specific period of time.

The sense node sensing unit 250 couples the common node CN and the ground voltage terminal Vss when the sense node SO is at a high level.

The main latch unit 240 couples the common node CN and the first node QM in response to the main latch reset signal MRST so that the first node QM is reset to a low level.

The precharge unit 220 precharges the sense node SO in response to the precharge signal PRECH_N of a low level so that the sense node SO maintains a high level for a specific period of time.

The voltage supply unit 400 generates a second read voltage R3.3 and the pass voltage in response the control signal of the controller 300. The X decoder 500 applies the second read voltage R3.3 to the word line WL0 coupled to a memory cell (e.g., MC0), selected from among the memory cells MC0, MC1, . . . , MCn of the memory cell array 100, and applies the pass voltage to the remaining memory cells MC1, MC2, . . . , MCn. The second read voltage R3.3 may be lower than the first read voltage R2.2 by a specific level.

The bit line select unit 210 couples the even bit line BLe, coupled to the memory cell MC0, and the sense node SO. As a result, the voltage of the sense node SO is maintained at a high level or discharged to a low level depending on the threshold voltage of the memory cell MC0.

The sense node sensing unit 250 connects or disconnects the common node CN and the ground voltage terminal Vss depending on the voltage level of the sense node SO. The main latch unit 240 couples the common node CN and the second node QM_N in response to the main latch set signal MSET.

Consequently, over-sampling read data is stored in the latch of the main latch unit 240 by maintaining or inverting data value in the latch of the main latch unit 240 depending on the voltage level of the sense node SO determined based on the threshold voltage of the memory cell MC0. In an embodiment of the present invention, the over-sampling read data is the data read by using the second read voltage R3.3 as a read voltage.

In the operation of reading out the over-sampling read data, the data read signal PBDO is applied to the data read unit 260, and thus the normal read data stored in the cache latch unit 230 is transferred to the data line DL. That is, the total read time can be reduced by a cache read method of simultaneously performing the read operation of storing the over-sampling read data in the main latch unit 240 and the operation of outputting the normal read data stored in the cache latch unit 230.

5) Performing a Third Read Operation (S15)

The precharge unit 220 precharges the sense node SO in response to the precharge signal PRECH_N of a low level so that the sense node SO maintains a high level for a specific period of time.

The voltage supply unit 400 generates a third read voltage R3.4 and the pass voltage in response the control signal of the controller 300. The X decoder 500 applies the third read voltage R3.4 to the word line WL0 coupled to a memory cell (e.g., MC0), selected from among the memory cells MC0, MC1, ..., MCn of the memory cell array 100, and applies the pass voltage to the remaining memory cells MC1, MC2, ..., MCn. The third read voltage R3.4 may be higher than the first read voltage R2.2 by a specific level.

The bit line select unit 210 couples the even bit line BLe, coupled to the memory cell MC0, and the sense node SO. As a result, the voltage of the sense node SO is maintained at a high level or discharged to a low level depending on the threshold voltage of the memory cell MC0.

The sense node sensing unit 250 connects or disconnects the common node CN and the ground voltage terminal Vss depending on the voltage level of the sense node SO. The main latch unit 240 couples the common node CN and the first node QM in response to the main latch reset signal MRST.

Consequently, the latch of the main latch unit 240 in which the over-sampling read data is previously stored maintains or inverts the existing data value depending on the voltage level of the sense node SO determined based on the threshold voltage of the memory cell MC0. Accordingly, new over-sampling read data is stored in the latch of the main latch unit 240. That is, the two over-sampling data read out using the second read voltage R3.3 and the third read voltage R3.4 are overlapped with each other and stored. If the threshold voltage of the memory cell MC0 exists between the second read voltage R3.3 and the third read voltage R3.4, over-sampling read data is stored according to the voltage of the second node QM_N, e.g., a low level. If the threshold voltage of the memory cell MC0 does not exist between the second read voltage R3.3 and the third read voltage R3.4, over-sampling read data is stored according to the voltage of the second node QM_N, e.g., a high level. Accordingly, over-sampling read data may be used to determine whether the threshold voltage of a selected memory cell does not fall within a set voltage distribution.

6) Transferring the Over-Sampling Read Data from the Main Latch Unit to the Cache Latch Unit (S16)

The precharge unit 220 precharges the sense node SO in response to the precharge signal PRECH_N of a low level so that the sense node SO maintains a high level for a specific period of time.

The second node QM_N and the sense node SO are coupled in response to the transfer signal TRANM applied to the main latch unit 240. As a result, the voltage of the sense node SO is maintained at a high level or discharged to a low level depending on the over-sampling read data stored in the main latch unit 240.

The sense node sensing unit 250 connects or disconnects the common node CN and the ground voltage terminal Vss depending on the voltage level of the sense node SO. The cache latch unit 230 connects the common node CN and the fourth node QC_N in response to the cache latch set signal CSET.

Consequently, the over-sampling read data is stored in the latch of the cache latch unit 230 by maintaining or inverting data value in the latch of the cache latch unit 230 depending on the voltage level of the sense node SO determined based on the over-sampling read data stored in the main latch unit 240.

7) Outputting the Over-Sampling Read Data Stored in the Cache Latch Unit (S17)

The data read signal PBDO is applied to the data read unit 260, and thus over-sampling read data stored in the cache latch unit 230 is transferred to the data line DL.

LSB data is outputted by performing ECC processing using the normal read data and the over-sampling read data.

Figure 6:
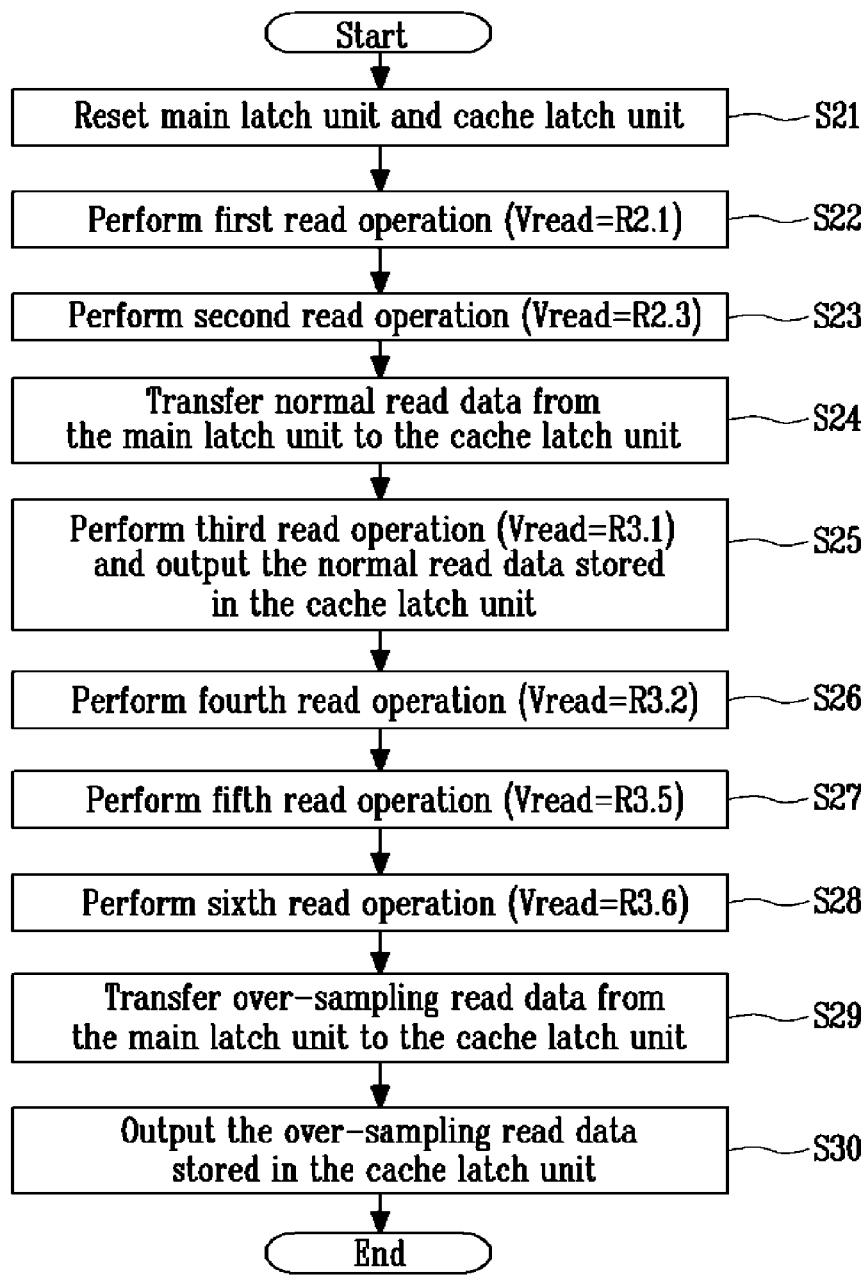
FIG. 6 is a flowchart illustrating a most significant bit (hereinafter referred to as an 'MSB') data read operation according to an exemplary embodiment of the present invention.
Figure 7:
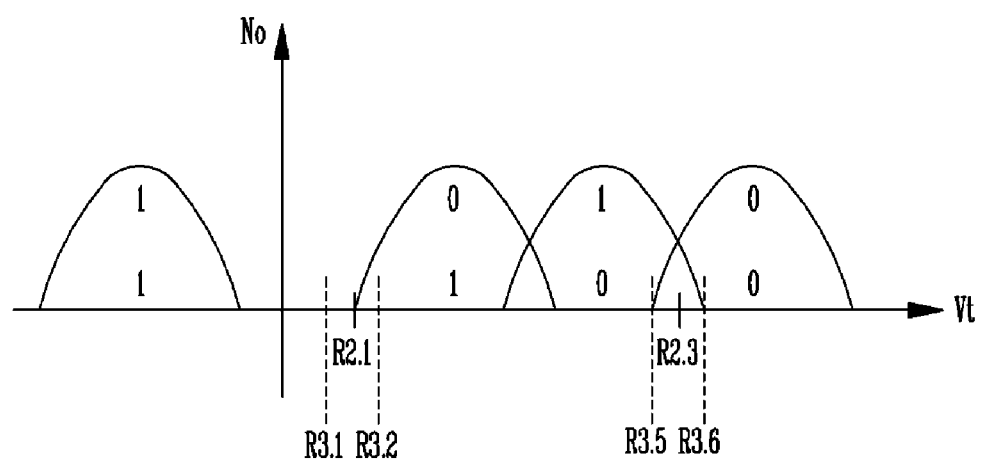
FIG. 7 shows threshold voltage distributions of the MSB data read operation according to an exemplary embodiment of the present invention.

FIG. 6 is a flowchart illustrating an MSB data read operation according to an exemplary embodiment of the present invention. FIG. 7 shows threshold voltage distributions of the MSB data read operation according to an exemplary embodiment of the present invention.

The MSB data read operation according to an exemplary embodiment of the present invention is described below with reference to FIGS. 2, 3, 6, and 7.

1) Resetting the Main Latch Unit and the Cache Latch Unit (S21)

The precharge unit 220 precharges the sense node SO in response to the precharge signal PRECH_N of a low level so that the sense node SO maintains a high level during a certain period. The sense node sensing unit 250 couples the common node CN and the ground voltage terminal Vss when the sense node SO is at a high level.

The main latch unit 240 couples the common node CN and the first node QM in response to the main latch reset signal MRST so that the voltage of the first node QM is reset to a low level.

The cache latch unit 230 couples the common node CN and the third node QC in response to the cache latch reset signal CRST so that the voltage of the third node QC is reset to a low level.

2) Performing a First Read Operation (S22)

The precharge unit 220 of the page buffer 200 precharges the sense node SO in response to the precharge signal PRECH_N of a low level so that the sense node SO maintains a high level for a specific period of time.

The voltage supply unit 400 generates a first read voltage R2.1 and a pass voltage in response to the control signal of the controller 300. The X decoder 500 applies the first read voltage R2.1 to the word line WL0 coupled to a memory cell (e.g., MC0), selected from among the memory cells MC0, MC1, ..., MCn of the memory cell array 100 and applies the pass voltage to the remaining memory cells MC1, MC2, ..., MCn.

The bit line select unit 210 couples a bit line (e.g., the even bit line BLe), selected from among the even bit line BLe and the odd bit line BLo, and the sense node SO. As a result, the voltage of the sense node SO is maintained at a high level or discharged to a low level depending on the threshold voltage of the memory cell MC0.

The sense node sensing unit 250 connects or disconnects the common node CN and the ground voltage terminal Vss depending on the voltage level of the sense node SO. The main latch unit 240 couples the common node CN and the second node QM_N in response to the main latch set signal MSET.

Consequently, normal read data is stored in the latch of the main latch unit 240 by maintaining or inverting data value in the latch of the main latch unit 240 depending on the voltage level of the sense node SO determined based on the threshold voltage of the memory cell MC0. In an embodiment of the present invention, the normal read data is the data read by using the first read voltage R2.1 as a read voltage.

3) Performing a Second Read Operation (S23)

The precharge unit 220 of the page buffer 200 precharges the sense node SO in response to the precharge signal PRECH_N of a low level so that the sense node SO maintains a high level for a specific period of time.

The voltage supply unit 400 generates a second read voltage R2.3 and the pass voltage in response to the control signal of the controller 300. The X decoder 500 applies the second read voltage R2.3 to the word line WL0 coupled to a memory cell (e.g., MC0), selected from among the memory cells MC0, MC1, . . . , MCn of the memory cell array 100 and applies the pass voltage to the remaining memory cells MC1, MC2, . . . , MCn.

The bit line select unit 210 couples a bit line (e.g., the even bit line BLe), selected from among the even bit line BLe and the odd bit line BLo, and the sense node SO. As a result, the voltage of the sense node SO is maintained at a high level or discharged to a low level depending on the threshold voltage of the memory cell MC0.

The sense node sensing unit 250 connects or disconnects the common node CN and the ground voltage terminal Vss depending on the voltage level of the sense node SO. The main latch unit 240 couples the common node CN and the first node QM in response to the main latch reset signal MRST.

Consequently, the latch of the main latch unit 240 in which the normal read data is previously stored maintains or inverts the voltage level of the existing data value depending on the voltage level of the sense node SO determined based on the threshold voltage of the memory cell MC0. Accordingly, new normal read data is stored in the latch of the main latch unit 240. That is, the two normal data read out using the first read voltage R2.1 and the second read voltage R2.3 are overlapped with each other and stored.

4) Transferring the Normal Read Data from the Main Latch Unit to the Cache Latch Unit (S24)

The precharge unit 220 precharges the sense node SO in response to the precharge signal PRECH_N of a low level so that the sense node SO maintains a high level for a specific period of time.

The second node QM_N and the sense node SO are coupled in response to the transfer signal TRANM applied to the main latch unit 240. As a result, the voltage of the sense node SO is maintained at a high level or discharged to a low level depending on the normal read data stored in the main latch unit 240.

The sense node sensing unit 250 connects or disconnects the common node CN and the ground voltage terminal Vss depending on the voltage level of the sense node SO. The cache latch unit 230 couples the common node CN and the fourth node QC_N in response to the cache latch set signal CSET.

Consequently, the normal read data is stored in the latch of the cache latch unit 230 by maintaining or inverting data value in the latch of the cache latch unit 230 depending on the voltage level of the sense node SO determined based on the normal read data stored in the main latch unit 240.

5) Performing a Third Read Operation and Output the Normal Read Data Stored in the Cache Latch Unit (S25)

The precharge unit 220 precharges the sense node SO in response to the precharge signal PRECH_N of a low level so that the sense node SO maintains a high level for a specific period of time.

The sense node sensing unit 250 couples the common node CN and the ground voltage terminal Vss when the sense node SO is at a high level.

The main latch unit 240 couples the common node CN and the first node QM in response to the main latch reset signal MRST so that the voltage of the first node QM is reset to a low level.

The precharge unit 220 precharges the sense node SO in response to the precharge signal PRECH_N of a low level so that the sense node SO maintains a high level for a specific period of time.

The voltage supply unit 400 generates a third read voltage R3.1 and the pass voltage in response the control signal of the controller 300. The X decoder 500 applies the third read voltage R3.1 to the word line WL0 coupled to a memory cell (e.g., MC0), selected from among the memory cells MC0, MC1, . . . , MCn of the memory cell array 100, and applies the pass voltage to the remaining memory cells MC1, MC2, . . . , MCn. The third read voltage R3.1 may be lower than the first read voltage R2.1 by a specific level.

The bit line select unit 210 couples the even bit line BLe, coupled to the memory cell MC0, and the sense node SO. As a result, the voltage of the sense node SO is maintained at a high level or discharged to a low level depending on the threshold voltage of the memory cell MC0.

The sense node sensing unit 250 connects or disconnects the common node CN and the ground voltage terminal Vss depending on the voltage level of the sense node SO. The main latch unit 240 couples the common node CN and the second node QM_N in response to the main latch set signal MSET.

Consequently, over-sampling read data is stored in the latch of the main latch unit 240 by maintaining or inverting data value in the latch of the main latch unit 240 depending on the voltage level of the sense node SO determined based on the threshold voltage of the memory cell MC0. In an embodiment of the present invention, the over-sampling read data is the data read by using the third read voltage R3.1 as a read voltage.

In the operation of reading out the over-sampling read data, the data read signal PBDO is applied to the data read unit 260, and thus the normal read data stored in the cache latch unit 230 is transferred to the data line DL. That is, the total read time can be reduced by a cache read method of simultaneously performing the read operation of storing the over-sampling read data in the main latch unit 240 and the operation of outputting the normal read data stored in the cache latch unit 230.

6) Performing a Fourth Read Operation (S26)

The precharge unit 220 precharges the sense node SO in response to the precharge signal PRECH_N of a low level so that the sense node SO maintains a high level for a specific period of time.

The voltage supply unit 400 generates a fourth read voltage R3.2 and the pass voltage in response the control signal of the controller 300. The X decoder 500 applies the fourth read voltage R3.2 to the word line WL0 coupled to a memory cell (e.g., MC0), selected from among the memory cells MC0, MC1, . . . , MCn of the memory cell array 100, and applies the pass voltage to the remaining memory cells MC1, MC2, . . . , MCn. The fourth read voltage R3.2 may be higher than the first read voltage R2.1 by a specific level.

The bit line select unit 210 couples the even bit line BLe, coupled to the memory cell MC0, and the sense node SO. As a result, the voltage of the sense node SO is maintained at a high level or discharged to a low level depending on the threshold voltage of the memory cell MC0.

The sense node sensing unit 250 connects or disconnects the common node CN and the ground voltage terminal Vss depending on the voltage level of the sense node SO. The main latch unit 240 couples the common node CN and the first node QM in response to the main latch reset signal MRST.

Consequently, the latch of the main latch unit 240 in which the over-sampling read data is previously stored maintains or inverts the existing data value depending on the voltage level of the sense node SO determined based on the threshold voltage of the memory cell MC0. Accordingly, new over-sampling read data is stored in the latch of the main latch unit 240. That is, the two over-sampling data read out using the third read voltage R3.1 and the fourth read voltage R3.2 are overlapped with each other and stored. If the threshold voltage of the memory cell MC0 exists between the third read voltage R3.1 and the fourth read voltage R3.2, over-sampling read data is stored according to the voltage of the second node QM_N, e.g., a low level. If the threshold voltage of the memory cell MC0 does not exist between the third read voltage R3.1 and the fourth read voltage R3.2, over-sampling read data is stored according to the voltage of the second node QM_N, e.g., a high level.

7) Performing a Fifth Read Operation (S27)

The precharge unit 220 precharges the sense node SO in response to the precharge signal PRECH_N of a low level so that the sense node SO maintains a high level for a specific period of time.

The voltage supply unit 400 generates a fifth read voltage R3.5 and the pass voltage in response the control signal of the controller 300. The X decoder 500 applies the fifth read voltage R3.5 to the word line WL0 coupled to a memory cell (e.g., MC0), selected from among the memory cells MC0, MC1, ..., MCn of the memory cell array 100, and applies the pass voltage to the remaining memory cells MC1, MC2, ..., MCn. The fifth read voltage R3.5 may be lower than the second read voltage R2.3 by a specific level.

The bit line select unit 210 couples the even bit line BLe, coupled to the memory cell MC0, and the sense node SO. As a result, the voltage of the sense node SO is maintained at a high level or discharged to a low level depending on the threshold voltage of the memory cell MC0.

The sense node sensing unit 250 connects or disconnects the common node CN and the ground voltage terminal Vss depending on the voltage level of the sense node SO. The main latch unit 240 couples the common node CN and the second node QM_N in response to the main latch reset signal MRST.

Consequently, the latch of the main latch unit 240 in which the over-sampling read data is previously stored maintains or inverts the existing data value depending on the voltage level of the sense node SO determined based on the threshold voltage of the memory cell MC0. Accordingly, new over-sampling read data is stored in the latch of the main latch unit 240.

8) Perform a Sixth Read Operation (S28)

The precharge unit 220 precharges the sense node SO in response to the precharge signal PRECH_N of a low level so that the sense node SO maintains a high level for a specific period of time.

The voltage supply unit 400 generates a sixth read voltage R3.6 and the pass voltage in response the control signal of the controller 300. The X decoder 500 applies the sixth read voltage R3.6 to the word line WL0 coupled to a memory cell (e.g., MC0), selected from among the memory cells MC0, MC1, ..., MCn of the memory cell array 100, and applies the pass voltage to the remaining memory cells MC1, MC2, ..., MCn. The sixth read voltage R3.6 may be higher than the second read voltage R2.3 by a specific level.

The bit line select unit 210 couples the even bit line BLe, coupled to the memory cell MC0, and the sense node SO. As a result, the voltage of the sense node SO is maintained at a high level or discharged to a low level depending on the threshold voltage of the memory cell MC0.

The sense node sensing unit 250 connects or disconnects the common node CN and the ground voltage terminal Vss depending on the voltage level of the sense node SO. The main latch unit 240 couples the common node CN and the first node QM in response to the main latch reset signal MRST.

Consequently, the latch of the main latch unit 240 in which the over-sampling read data is previously stored maintains or inverts the existing data value depending on the voltage level of the sense node SO determined based on the threshold voltage of the memory cell MC0. Accordingly, new over-sampling read data is stored in the latch of the main latch unit 240. That is, the over-sampling data read out by the third to sixth read operations are overlapped with each other and stored in the latch of the main latch unit 240 as a single over-sampling datum. The final over-sampling data indicates whether the threshold voltage of a selected memory cell exists between the third read voltage R3.1 and the fourth read voltage R3.2 or between the fifth read voltage R3.5 and the sixth read voltage R3.6. Accordingly, over-sampling read data may be used to determine whether the threshold voltage of a selected memory cell falls within a set voltage distribution.

9) Transfer the Over-Sampling Read Data from the Main Latch Unit to the Cache Latch Unit (S29)

The precharge unit 220 precharges the sense node SO in response to the precharge signal PRECH_N of a low level so that the sense node SO maintains a high level for a specific period of time.

The second node QM_N and the sense node SO are coupled in response to the transfer signal TRANM applied to the main latch unit 240. As a result, the voltage of the sense node SO is maintained at a high level or discharged to a low level depending on the over-sampling read data stored in the main latch unit 240.

The sense node sensing unit 250 connects or disconnects the common node CN and the ground voltage terminal Vss depending on the voltage level of the sense node SO. The cache latch unit 230 connects the common node CN and the fourth node QC_N in response to the cache latch set signal CSET.

Consequently, the over-sampling read data is stored in the latch of the cache latch unit 230 by maintaining or inverting data value in the latch of the cache latch unit 230 depending on the voltage level of the sense node SO determined based on the over-sampling read data stored in the main latch unit 240.

10) Output the Over-Sampling Read Data Stored in the Cache Latch Unit (S30)

The data read signal PBDO is applied to the data read unit 260, and thus the over-sampling read data stored in the cache latch unit 230 is transferred to the data line DL.

MSB data is outputted by performing ECC processing using the read normal read data and the over-sampling read data.

As described above, in an LSB data read operation and an MSB data read operation, both normal read data and over-sampling read data are read out by using the cache read method. Accordingly, the time taken for the read operations can be reduced and the efficiency of ECC processing can be improved because the number of data for the ECC processing is increased.

Furthermore, in an embodiment of the present invention, the cache read method of reading out normal data from a memory cell using a normal read voltage and of reading out over-sampling data, indicating whether the threshold voltage of the memory cell falls within a specific voltage distribution, using a first read voltage lower than the normal read voltage and a second read voltage higher than the normal read voltage in a read operation is used. Accordingly, the read time can be reduced.

What is claimed is:

1. A semiconductor memory device, comprising:
 a memory cell array comprising a plurality of memory cells coupled in series between a bit line and a common source line;
 peripheral circuits configured to read out data stored in a memory cell, selected from among the plurality of memory cells, by sequentially applying a plurality of read voltages to a word line, coupled to the selected memory cell, in a read operation; and a controller configured to control the peripheral circuits so that the peripheral circuits sense a voltage level of the bit line and read normal read data when a first read voltage, among the plurality of read voltages, is applied and the peripheral circuits overlap data, read by sensing a voltage level of the bit line when a second read voltage lower than the first read voltage by a specific level is applied, with data read by sensing a voltage level of the bit line when a third read voltage higher than the first read voltage by the specific level is applied, to generate over-sampling data in order to determine whether a threshold voltage distribution of the selected memory cell falls within a set voltage distribution in the read operation.

2. The semiconductor memory device of claim 1, wherein the peripheral circuits comprise:

a voltage supply unit for applying the plurality of read voltages to the word line; and a page buffer for outputting the normal read data by sensing the voltage level of the bit line when the first read voltage is applied and for outputting the over-sampling read data by sensing the voltage level of the bit line when the second and the third read voltages are applied.

3. The semiconductor memory device of claim 2, wherein the controller controls the page buffer so that the page buffer reads out the normal read data and the over-sampling read data by using a cache read method.

4. The semiconductor memory device of claim 2, wherein the page buffer simultaneously performs an operation of outputting the normal read data to a data line and an operation of storing the over-sampling read data.

5. The semiconductor memory device of claim 2, wherein the page buffer comprises:

a main latch unit for temporarily storing the normal read data or the over-sampling read data by sensing the voltage level of the bit line; and a cache latch unit for temporarily storing the normal read data or the over-sampling read data received from the main latch unit and for outputting the temporarily stored normal read data or over-sampling read data to the data line, wherein when the main latch unit temporarily stores the over-sampling read data, the cache latch unit outputs the temporarily stored normal read data to the data line.

6. The semiconductor memory device of claim 5, wherein the main latch unit stores first over-sampling read data, obtained by sensing the voltage level of the bit line when the second read voltage is applied to the selected memory cell, and second over-sampling read data, obtained by sensing the voltage level of the bit line when the third read voltage is applied to the selected memory cell.

7. A method of reading out data stored in a semiconductor memory device, the method comprising:

applying a first read voltage to a word line coupled to a memory cell;

storing first data in a cache latch unit of a page buffer by sensing a voltage of a bit line coupled to the memory cell;

storing temporary data in a main latch unit of the page buffer by applying a second read voltage lower than the first read voltage to a word line of the selected memory cell and sensing a voltage level of the bit line;

storing second data in the main latch unit of the page buffer by applying a third read voltage higher than the first read voltage to the word line of the selected memory cell, sensing a voltage level of the bit line, and overlapping data with the temporary data stored in the main latch unit of the page buffer; and transferring the second data of the main latch unit to the cache latch unit and then outputting the second data to the data line.

8. The method of claim 7, wherein storing the first data in the cache latch unit comprises:

storing the first data in the main latch unit by sensing the voltage level of the bit line; and transferring the first data of the main latch unit to the cache latch unit.

9. The method of claim 7, wherein the first data stored in the cache latch unit is outputted to the data line when the temporary data is stored in the main latch unit.

10. The method of claim 7, wherein the second data indicates whether the threshold voltage of the memory cell exists between the second read voltage and the third read voltage.

11. A method of reading out data stored in a semiconductor memory device, the method comprising:

storing first normal data in a main latch unit of a page buffer by applying a first read voltage to a word line coupled to a memory cell and by sensing a voltage level of a bit line coupled to the memory cell;

storing second normal data in the main latch unit in which the first normal data is stored so that the second normal data is overlapped with the first normal data, by applying a second read voltage to the word line and by sensing a voltage level of the bit line;

transferring the second normal data to a cache latch unit of the page buffer and storing the second normal data in the cache latch unit;

applying the third read voltage to the word line;

storing first over-sampling data in the main latch unit by sensing the voltage level of the bit line;

applying the fourth read voltage to the word line;

storing second over-sampling data in the main latch unit in which the first over-sampling data is stored so that the second over-sampling data is overlapped with the first over-sampling data, by sensing the voltage level of the bit line;

applying the fifth read voltage to the word line;

storing third over-sampling data in the main latch unit in which the second over-sampling data is stored so that the third over-sampling data is overlapped with the second over-sampling data, by sensing the voltage level of the bit line;

applying the sixth read voltage to the word line; and storing fourth over-sampling data in the main latch unit in which the third over-sampling data is stored so that the fourth over-sampling data is overlapped with the third over-sampling data, by sensing the voltage level of the bit line;

outputting the second normal data of the cache latch unit to a data line; and transferring the over-sampling data of the main latch unit to the cache latch unit and then outputting the over-sampling data to the data line.

12. The method of claim 11, wherein the second normal data is most significant bit (MSB) data of multi-bit data.

13. The method of claim 11, wherein the second normal read data is outputted to the data line when the over-sampling data is stored in the main latch unit.

14. The method of claim 11, wherein the second normal data stored in the cache latch unit is outputted to the data line when the first over-sampling data is stored in the main latch unit.

15. The method of claim 11, wherein the over-sampling data indicates whether a threshold voltage of the memory cell exists between the third read voltage and the fourth read voltage or between the fifth read voltage and the sixth read voltage.

* * * * *